(12) United States Patent
Freedman et al.

(10) Patent No.: US 9,372,402 B2
(45) Date of Patent: Jun. 21, 2016

(54) MOLECULAR ORGANOMETALLIC RESISTS FOR EUV

(71) Applicant: The Research Foundation for the State University of New York, Albany, NY (US)

(72) Inventors: Daniel Freedman, Red Hook, NY (US); Miles Marnell, Rochester, NY (US); Robert Brainard, Albany, NY (US); Brian Cardineau, Beaverton, OR (US)

(73) Assignee: The Research Foundation for the State University of New York, Albany ( * ) Notice: Subject to any disclaimer, the term of this patent is extended or adjusted under 35 U.S.C. 154(b) by 163 days.

(21) Appl. No.: 14/026,761

(22) Filed: Sep. 13, 2013

(65) Prior Publication Data

US 2015/0079393 A1   Mar. 19, 2015

(51) Int. Cl.
*G03F 7/004* (2006.01)

(52) U.S. Cl.
CPC ......... *G03F 7/0042* (2013.01); *Y10T 428/2982* (2015.01)

(58) Field of Classification Search
CPC .......... G03F 7/0042; B82Y 30/00; C08J 3/12; Y10T 428/2982
USPC .................. 428/402; 546/2, 9, 10; 556/13, 21
See application file for complete search history.

(56) References Cited

U.S. PATENT DOCUMENTS

| | | | |
|---|---|---|---|
| 5,281,447 A | 1/1994 | Brady et al. | |
| 6,899,995 B2 * | 5/2005 | Feiring et al. | 430/272.1 |
| 7,709,177 B2 * | 5/2010 | Angelopoulos et al. | 430/166 |
| 7,923,177 B2 * | 4/2011 | Charpin-Nicolle | 430/5 |
| 8,163,462 B2 * | 4/2012 | Toriumi et al. | 430/270.1 |
| 8,980,538 B2 * | 3/2015 | Somervell et al. | 430/325 |
| 2009/0269678 A1 * | 10/2009 | Charpin-Nicolle | 430/5 |
| 2009/0317742 A1 * | 12/2009 | Toriumi et al. | 430/270.1 |
| 2012/0103935 A1 * | 5/2012 | Cheng et al. | 216/37 |
| 2012/0315451 A1 * | 12/2012 | Malik et al. | 428/209 |
| 2013/0280912 A1 * | 10/2013 | Ogihara et al. | 438/694 |

OTHER PUBLICATIONS

Robert L. Brainard et al., "Resists for Next Generation Lithography", Microelectronic Engineering 61-62, pp. 707-715 (2002).
Brian Cardineau et al., "Tightly-Bound Ligands for Hafnium Nanoparticle EUV Resists, Extreme Ultraviolet (EUV) Lithography III", Proc. of SPIE, vol. 8322, 83220V1-V10 (2012).
Robert L. Brainard, "Photoresists for Extreme Ultraviolet Lithography", Chapter 8, In: EUV Lithography, SPIE Press, pp. 1A-58A (2009).
R.G. Goel, "Organoantimony Compounds. II. Studies on Tetraphenylantimony(V) Derivatives" Canadian Journal of Chemistry, 47(24), pp. 4607-4612 (1969).
R.G. Goel et al., "Organoantimony Compounds. I. Infrared Spectra of Some Trimethyl- and Triphenyl-Antimony Derivatives," Canadian Journal of Chemistry, 47(8), pp. 1423-1427 (1969).
Adonis Georgiades et al., "Reaktion von Triphenylbismutan Mit Aliphatischen Discarbonsäuren (Reactions of Triphenylbismuthan with Aliphatic Dicarbonic Acids)," Zeitschrift für Naturforschung B, 35(8), pp. 1000-1001 (1980). With English Abstract.
Ralph S. Paonessa et al., "Photochemical Generation of Bis(phosphine)palladium and Bis(phosphine)platinum Equivalents", Organometallics, 4, pp. 647-657 (1985).
Seik Weng NG et al., "Synthesis of Triorganostannate Esters of Dicarboxylic Acids. Crystal Structure of Bis(dicyclohexylammonium) Trisoxalatotetrakis(tri-n-butylstannate)-2 Ethanol," Journal of Organometallic Chemistry, 390, pp. 19-28 (1990).
K.K. Verma et al., "Diaryltellurium(IV) Carboxylates: Synthesis Via Telluroxides and Their Characterization," Phosphorous, Sulfur and Silicon, vol. 166, pp. 231-241 (2000).
Z.G. Zhang et al., "Studies on the Biological Activities and Synthesis of Tri (2-methyl-2-phenylpropyl) Tinoxide Derivatives," Chemical Journal of Chinese Universities-Chinese, 23(3), pp. 399-402 (2002). (With Abstract).

* cited by examiner

*Primary Examiner* — Leszek Kiliman
(74) *Attorney, Agent, or Firm* — Heslin, Rothenberg, Farley & Mesiti, P.C.

(57) ABSTRACT

Described herein are organometallic or inorganic complexes with high extreme ultraviolet (EUV) optical density (OD) and high mass density for use in thin films. These thin films are used as high resolution, low line edge roughness (LER) EUV photoresists. The complexes may also be included in nanoparticle form for use in photoresists.

19 Claims, 4 Drawing Sheets

MOLECULAR ORGANOMETALLIC RESISTS FOR EUV

BACKGROUND OF THE INVENTION

1. Technical Field

The present invention generally relates to thin films containing organometallic or inorganic compounds with high extreme ultraviolet (EUV) optical density (OD) and high mass densities as high resolution, low line edge roughness (LER) EUV photoresists.

2. Background Information

A cycle of a typical silicon lithography procedure begins by applying a layer of photoresist—a material that undergoes a chemical transformation when exposed to actinic radiation (generally but not necessarily visible light, ultraviolet light, electron beam, or ion beam)—to the top of the substrate and drying the photoresist material in place, a step often referred to as "soft baking" of the photoresist, since typically this step is intended to eliminate residual solvents. A transparent plate, called a photomask or shadowmask, which has areas that are opaque to the radiation to be used as well as areas that are transparent to the radiation, is placed between a radiation source and the layer of photoresist. Those portions of the photoresist layer not covered by the opaque areas of the photomask are then exposed to radiation from the radiation source. Exposure is followed by development. In some cases, exposure is followed by a post-exposure bake (PEB), which precedes the development. Development is a process in which the entire photoresist layer is chemically treated. During development, the exposed and unexposed areas of photoresist have different solubility properties, so that one set of areas is removed and the other remains on the substrate. After development, those areas of the top layer of the substrate which are uncovered as a result of the development step are removed using an etch process. When a "positive" photoresist is used, the opaque areas of the photomask correspond to the areas where photoresist will remain upon developing (and hence where the topmost layer of the substrate, such as a layer of conducting metal, will remain at the end of the cycle). "Negative" photoresists result in the opposite—any area that is exposed to radiation will remain after developing, and the masked areas that are not exposed to radiation will be removed upon developing.

The need to make circuits physically smaller has steadily progressed over time, necessitating inter alia the use of light of increasingly shorter wavelengths to enable the formation of these smaller circuits. At present, it is desired to use light in the extreme ultraviolet (EUV) range (13.5 nm or shorter) for photolithography of circuits having line widths of 32-20 nm. This in turn has necessitated changes in the materials used as photoresists, since in order to be useful as a photoresist, the material should absorb some of the light at the wavelength used. If too much light is absorbed, then the light may not reach the bottom of the resists and the sides walls of the printed feature will be slanted rather than vertical. For example, phenolic materials which are commonly used for photolithography using light of wavelength 248 nm wavelength are generally not suitable for use as photoresists for light of 193 nm, since these phenolic materials tend to absorb too much 193 nm light. Conversely, if too little light is absorbed, then the exposure times will need to be long, resulting in poor manufacturing through-put, and higher manufacturing costs. X-ray lithography (~1 nm wavelength of light) has very long exposure times because very little of the x-rays are absorbed. [R. Brainard, G. Barclay, E. Anderson, L. Ocola, "Resists for next generation lithography", Microelectron. Eng. 61-62, 707-715 (2002).]

Extreme ultraviolet (EUV) photoresists are being driven to provide better resolution and sensitivity. In order to do so, the photoresists have to become thinner and thinner, but as they become thinner, it becomes harder to stop photons.

A need exists for resists with extremely high resolution imaging in EUV that will be capable of meeting the needs of the 10-nm node. In particular, a need exists for extreme ultraviolet (EUV) photoresists with high resolution imaging and low line edge roughness (LER).

SUMMARY OF THE INVENTION

The present invention provides, in a first aspect, a photoresist that includes at least one complex $(BD_2)_zM(L^a)_n(L^b)_o(L^c)_p(L^d)_q$ or $(A)_yM(L^e)_n(L^f)_o(L^g)_p(L^h)_q$. In these complexes, M is a metal having a coordination number of Q; Q is an integer selected from 2, 3, 4, 5, 6, 7, or 8; $BD_2$ is oxalate or carbonate; $L^a$, $L^b$, $L^c$ and $L^d$ are ligands, each having a denticity of, respectively, $w^a$, $w^b$, $w^c$ and $w^d$; z is 1, 2 or 3; n, o, p, and q are independently zero, one or two; the sum of $(n \cdot w^a)$ plus $(o \cdot w^b)$ plus $(p \cdot w^c)$ plus $(q \cdot w^d)$ is equal to (Q minus 2z); A is selected in each instance from azide and ($-NO_2$); $L^e$, $L^f$, $L^g$ and $L^h$ are ligands, each having a denticity of, respectively, $w^e$, $w^f$, $w^g$ and $w^h$; y is any integer up to and including Q; and the sum of $(n \cdot w^e)$ plus $(o \cdot w^f)$ plus $(p \cdot w^g)$ plus $(q \cdot w^h)$ is equal to (Q minus y). The complex may be balanced by a counter ion, if necessary.

The present invention provides, in a second aspect, a nanoparticle that includes at least one complex $(BD_2)_zM(L^a)_n(L^b)_o(L^c)_p(L^d)_q$ or $(A)_yM(L^e)_n(L^f)_o(L^g)_p(L^h)_q$. In these complexes, M is a metal having a coordination number of Q; Q is an integer selected from 2, 3, 4, 5, 6, 7, or 8; $BD_2$ is oxalate or carbonate; $L^a$, $L^b$, $L^c$ and $L^d$ are ligands, each having a denticity of, respectively, $w^a$, $w^b$, $w^c$ and $w^d$; z is 1, 2 or 3; n, o, p, and q are independently zero, one or two; the sum of $(n \cdot w^a)$ plus $(o \cdot w^b)$ plus $(p \cdot w^c)$ plus $(q \cdot w^d)$ is equal to (Q minus 2z); A is selected in each instance from azide and ($-NO_2$); $L^e$, $L^f$, $L^g$ and $L^h$ are ligands, each having a denticity of, respectively, $w^e$, $w^f$, $w^g$ and $w^h$; y is any integer up to and including Q; and the sum of $(n \cdot w^e)$ plus $(o \cdot w^f)$ plus $(p \cdot w^g)$ plus $(q \cdot w^h)$ is equal to (Q minus y). The complex may be balanced by a counter ion, if necessary. One of the ligands $L^a$, $L^b$, $L^c$, $L^d$, $L^e$, $L^f$, $L^g$, or $L^h$, when present, optionally may be native to the nanoparticle.

The present invention provides, in a third aspect, a nanoparticle which includes a ligand selected from oxalate, carbonate, azide, and $-NO_2$. In these embodiments, the ligand is bound to a metal atom of the nanoparticle. Assuming the nanoparticle to be roughly spherical, the diameter of the nanoparticle should be between 1 nm and 20 nm.

These, and other objects, features and advantages of this invention will become apparent from the following detailed description of the various aspects of the invention taken in conjunction with the accompanying drawings.

DETAILED DESCRIPTION OF THE INVENTION

Figure 1B:
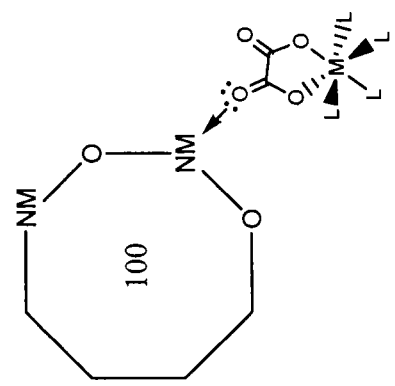
FIGS. 1A-1E show various configurations of nanoparticles of the invention.

This disclosure relates to a platform of photoresists that includes high optical density organometallic complexes. These materials possess the capability of stopping EUV photons in 20-nm films (high EUV OD) and converting the photons into secondary electrons with short diffusion lengths, causing a photochemical change that will result in negative- or positive-tone imaging.

The potential benefits of these resists are many. Organometallic films with high extreme ultraviolet optical density are able to stop more photons, thus, by utilizing these materials, thin film resists can be made without loss to sensitivity or line edge roughness. Line edge roughness increases as acid diffuses into the unexposed region, leading to a loss of resolution; however, since metals have a large range of redox potentials, the chemistry of these resists can be engineered for high sensitivity without acid catalysis, limiting potential acid diffusion problems. These materials also possess a high mass density, which causes the mean-free path of secondary-electrons to be shorter. For resists, this results in a decrease in electron blur. Finally, metal-containing films have excellent etch rates: metal oxide films have significantly better etch performance than even the best organic films.

To date, metals have not been used commonly in photoresists. Existing specifications generally require that the photoresist be metal-free, as metals can act as electron traps in semiconductors. One exception is hafnium oxide nanoparticles, which have been developed; however, these nanoparticles seem to possess a trade-off between good resolution (e.g., line edge roughness (LER)) and speed. The reactions are slow and require about five to ten times more photons (100-200 mJ/cm$^2$) than what is typical. Faster reactions with these nanoparticles result in lower resolution.

Metal complexes give an enormous range of possibilities for these resists because of the wide range of ligands and metals available. Various metals, including many of the first row transition metals, such as Cr, Mn, Fe, Co, Ni, Cu and Zn, have sufficiently high EUV optical densities, are inexpensive and non-toxic. The physical and electronic properties of these complexes can be readily varied by the judicious selection of the ligand substituents. This is an important consideration because solubility, crystallinity and coating properties are key considerations for developing useful resists. The complexes disclosed herein are chosen to provide characteristics that allow their use as a coating or film. The chemistry of the photoresists disclosed herein can be tuned by altering various parameters of the complexes and solvents; desired characteristics may be obtained by, for instance, using different metals, ligands, counter ions, and/or solvents. For instance, the solubility of the complex may be affected, and can thus be optimized as desired, by the charge of the complex, the ligands involved, the counter ion used, and/or the solvent utilized. The same is true for the dispersion characteristics of the nanoparticles of the invention. Solutions or dispersions containing the disclosed complexes or nanoparticles will optimally possess properties amenable to spin coating of the solution or dispersion to make the photoresist.

Appropriate compounds for photoresists should have a reasonable shelf life and be stable so that they can be stored until their use is necessary. However, they should also be reactive (i.e., unstable) when they are subjected to EUV or e-beam radiation. The hafnium oxide nanoparticles mentioned above, for example, have a good shelf life, but it takes a great deal of energy to make them react.

In the present disclosure, the terms "complex" and "compound" may be used interchangeably.

The present invention provides, in a first aspect, a photoresist that includes at least one complex $(BD_2)_zM(L^a)_n(L^b)_o(L^c)_p(L^d)_q$ or $(A)_yM(L^e)_n(L^f)_o(L^g)_p(L^h)_q$. The complex itself should not be a gas. In these embodiments, M represents a metal. For purposes of this disclosure, "metal" may be defined as any transition metal, post-transition metal, metalloid, or semimetal. The metals described herein for resist use are preferably "dark" elements, or those that have a high optical density and thus are more effective at stopping EUV. In some embodiments, the metal has an EUV optical density (EUV OD) of greater than 10/μm. In some embodiments, the metal has an EUV optical density (EUV OD) of greater than 15/μm. In some embodiments, the metal has an EUV optical density (EUV OD) of greater than 20/μm. In some embodiments, the metal has an EUV optical density (EUV OD) of greater than 30/μm. In some embodiments, the metal has an EUV optical density (EUV OD) of between 15/μm and 30/μm. Table 1 shows the EUV OD values of various elements. [R. Brainard, "Photoresists for Extreme Ultraviolet Lithography", In: EUV Lithography. SPIE Press, 2009; Berkeley website: B. L. Henke, E. M. Gullikson, and J. C. Davis, "X-ray interactions: photoabsorption, scattering, transmission, and reflection at E=50-30,000 eV, Z=1-92" Atomic Data & Nucl. Data Tables 54, 181-342 (1993); The "X-Ray Interaction with Matter" website (http://www-cxro.lbl.gov/optical_constants/filter2.html) has an algorithm for calculating the absorption of EUV by thin films.]

TABLE 1

Optical Density of the Elements

| Z | Symbol | Density g/cm3 | EUV OD/um |
|---|---|---|---|
| 1 | H | 0.09 | 0.1 |
| 2 | He | 0.1785 | 0.6 |
| 3 | Li | 0.534 | 4.3 |
| 4 | Be | 1.85 | 0.7 |
| 5 | B | 2.31 | 1.6 |
| 6 | C | 2.25 | 2.8 |
| 7 | N | 1.25 | 2.8 |
| 8 | O | 1.43 | 4.9 |
| 9 | F | 1.69 | 7.5 |
| 10 | Ne | 0.9 | 5.3 |
| 11 | Na | 0.97 | 6.3 |
| 12 | Mg | 1.74 | 11.2 |
| 13 | Al | 2.7 | 12.0 |
| 14 | Si | 2.33 | 0.7 |
| 15 | P | 1.82 | 0.8 |
| 16 | S | 2.07 | 1.4 |
| 17 | Cl | 3.21 | 2.6 |
| 18 | Ar | 1.78 | 1.6 |
| 19 | K | 0.86 | 0.9 |
| 20 | Ca | 1.54 | 1.4 |
| 21 | Sc | 2.99 | 3.7 |
| 22 | Ti | 4.5 | 7.0 |
| 23 | V | 5.96 | 9.8 |
| 24 | Cr | 7.2 | 15.6 |
| 25 | Mn | 7.47 | 13.0 |
| 26 | Fe | 7.86 | 21.0 |
| 27 | Co | 8.92 | 26.7 |
| 28 | Ni | 8.9 | 29.2 |
| 29 | Cu | 8.94 | 24.7 |
| 30 | Zn | 7.14 | 22.4 |
| 31 | Ga | 6.1 | 15.9 |
| 32 | Ge | 5.35 | 13.1 |
| 33 | As | 5.73 | 11.0 |
| 34 | Se | 4.81 | 6.5 |
| 35 | Br | 3.12 | 2.4 |

TABLE 1-continued

Optical Density of the Elements

| Z | Symbol | Density g/cm3 | EUV OD/um |
|---|---|---|---|
| 36 | Kr | 3.74 | 7.7 |
| 37 | Rb | 1.63 | 0.3 |
| 38 | Sr | 2.54 | 0.5 |
| 39 | Y | 4.47 | 0.9 |
| 40 | Zr | 6.51 | 1.5 |
| 41 | Nb | 8.57 | 2.1 |
| 42 | Mo | 10.22 | 2.6 |
| 43 | Tc | 11.5 | 4.9 |
| 44 | Ru | 12.37 | 6.9 |
| 45 | Rh | 12.41 | 12.6 |
| 46 | Pd | 12.02 | 18.8 |
| 47 | Ag | 10.5 | 32.1 |
| 48 | Cd | 8.65 | 22.2 |
| 49 | In | 7.31 | 28.3 |
| 50 | Sn | 7.31 | 29.4 |
| 51 | Sb | 6.68 | 27.2 |
| 52 | Te | 6.24 | 30.3 |
| 53 | I | 4.93 | 23.6 |
| 54 | Xe | 5.9 | 29.8 |
| 55 | Cs | 1.87 | 7.9 |
| 56 | Ba | 3.59 | 2.9 |
| 57 | La | 6.15 | 2.0 |
| 58 | Ce | 6.77 | 2.5 |
| 59 | Pr | 6.77 | 3.0 |
| 60 | Nd | 7.01 | 5.2 |
| 61 | Pm | 7.3 | 5.5 |
| 62 | Sm | 7.52 | 6.9 |
| 63 | Eu | 5.24 | 5.0 |
| 64 | Gd | 7.9 | 6.8 |
| 65 | Tb | 8.23 | 8.9 |
| 66 | Dy | 8.55 | 10.9 |
| 67 | Ho | 8.8 | 10.3 |
| 68 | Er | 9.07 | 10.9 |
| 69 | Tm | 9.32 | 11.4 |
| 70 | Yb | 6.9 | 8.9 |
| 71 | Lu | 9.84 | 10.9 |
| 72 | Hf | 13.31 | 14.0 |
| 73 | Ta | 16.65 | 16.5 |
| 74 | W | 19.35 | 13.4 |
| 75 | Re | 21.04 | 16.1 |
| 76 | Os | 22.6 | 17.6 |
| 77 | Ir | 22.4 | 17.9 |
| 78 | Pt | 21.45 | 24.3 |
| 79 | Au | 19.32 | 20.9 |
| 80 | Hg | 13.55 | 18.0 |
| 81 | Tl | 11.85 | 17.0 |
| 82 | Pb | 11.35 | 19.9 |
| 83 | Bi | 9.75 | 22.4 |
| 84 | Po | 9.3 | 22.5 |
| 85 | At | | |
| 86 | Rn | 9.73 | 29.7 |
| 87 | Fr | | |
| 88 | Ra | 5.5 | 21.0 |

In some embodiments, M is a transition metal. In other embodiments, M is selected from zirconium, manganese, aluminum, vanadium, titanium, chromium, manganese, iron, cobalt, nickel, copper, zinc, gallium, germanium, arsenic, molybdenum, ruthenium, rhodium, palladium, silver, cadmium, indium, tin, antimony, tellurium, iodine, thulium, hafnium, tantalum, tungsten, rhenium, osmium, iridium, platinum, gold, mercury, thallium, lead, and bismuth. In still other embodiments, M is selected from manganese, nickel, palladium, platinum, iron, antimony, tellurium, tin, cobalt, bismuth, chromium, and copper. In some embodiments, M is selected from chromium, copper, iron, tin, cobalt, and bismuth.

It is important to note that the designation of $(BD_2)_z M(L^a)_{nl}(L^b)_o(L^c)_p(L^d)_q$ or $(A)_y M(L^e)_n(L^f)_o(L^g)_p(L^h)_q$ in this application can represent neutral, cationic, or anionic complexes. If the complex is cationic or anionic, there will be a counter ion present. In some embodiments, the counter ion is selected from $P(R)_4^+$, $N(R)_4^+$, $S(R)_3^+$, and $I(R)_2^+$, wherein R is independently selected in each instance from $(C_1$-$C_8)$alkyl, aryl, and aryl$(C_{1-8})$alkyl. Non-limiting exemplary counter ions include $S(C_6H_5)_3^+$, $I(C_6H_5)_2^+$, $P(C_6H_5)_3(CH_2C_6H_5)^+$, $P(C_6H_5)_4^+$, $N(C_4H_9)_4^+$, $N(C_3H_7)_4^+$, $N(C_2H_5)_4^+$, $N(CH_3)_4^+$, $PF_6^-$, and $SbF_6^-$. In some embodiments, the counter ion is $P(C_6H_5)_3(CH_2C_6H_5)^+$, which is also known as BTP.

In some embodiments, M is a metal having a coordination number of Q. In other words, there will be Q coordination sites for M. In some embodiments, Q is an integer selected from 2, 3, 4, 5, 6, 7, or 8. In some embodiments, Q is 4. In other embodiments, Q is 6.

In some embodiments, $BD_2$ is an oxalate. In some embodiments, $BD_2$ is a carbonate. Both the oxalate and the carbonate make use of two coordination sites; so when one oxalate or carbonate is present, Q-2 sites are available for other ligands, as shown below.

In some embodiments, z is 1. An example of a complex where $BD_2$ is an oxalate and z is 1 is shown in illustrative structure (a) below (charges and counter ions not shown):

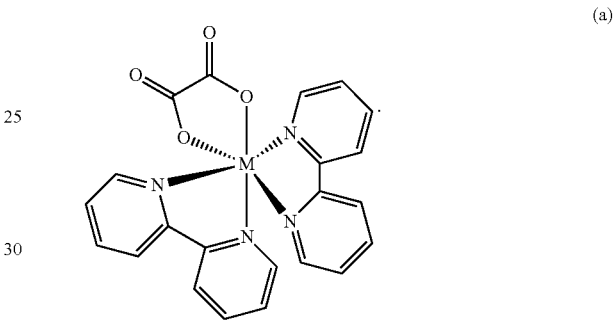

(a)

One oxalate is present (i.e., z is 1), but two of the six available coordination sites (Q) of M are used by one oxalate moiety. In some embodiments, z is two, as shown below in (b):

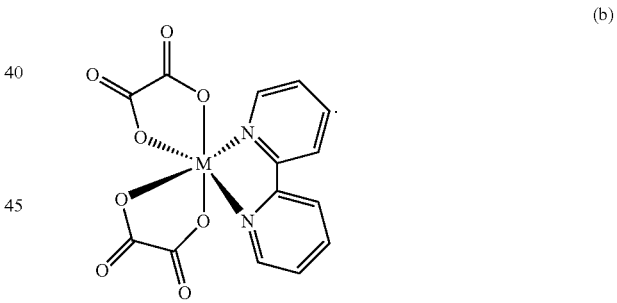

(b)

Here, two oxalates are present (z is 2), and four coordination sites of M are used by the two oxalate moieties. In other embodiments, z is three, as shown in the complex (c) below:

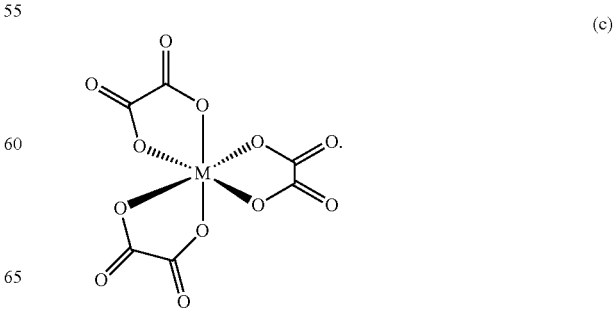

(c)

In this example, all six coordination sites are used by the three oxalate moieties.

Two examples of carbonate complexes are shown below:

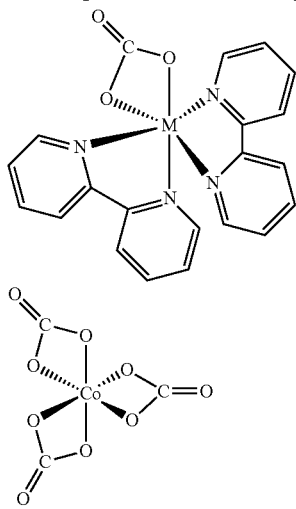

In some embodiments, $L^a, L^b, L^c, L^d, L^e, L^f, L^g,$ and $L^h$ are ligands. Each of these ligands, $L^a, L^b, L^c, L^d, L^e, L^f, L^g,$ and $L^h$, when present, can be monodentate or multidentate. The suffix "dentate" refers to the number of linkages formed by a ligand with a central metal atom in a coordination complex. If one atom of the ligand binds to the metal atom, the ligand is monodentate. If two atoms of the ligand bind to the metal atom, the ligand is bidentate. If three atoms of the ligand bind to the metal atom, the ligand is tridentate (and so on). For instance, the bipyridine moieties shown above in illustrative structures (a) and (b) are bidentate, as two atoms are connected to the metal atom. A terpyridine, however, could be tridentate when all three nitrogens bind to the metal atom:

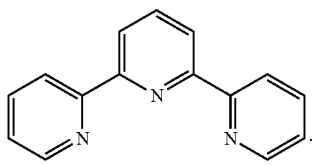 [SMILES: c1ccc(-c2cccc(-c3ccccn3)n2)nc1]

It is important to note that not all of the binding sites need to be on the same metal. As an example, if the ligand is bidentate (i.e., the denticity is two), the ligand could either coordinate to two sites on one metal atom or "bridge" between two metals, coordinating to one site on each metal. To be perfectly clear, if a ligand is tetradentate (i.e., four binding sites), all four binding sites could coordinate to one metal, or two, three, or four different metals could be coordinated to the four binding sites in some combination. For instance, two binding sites could coordinate to one metal and the other two binding sites could coordinate to another metal, or each of the other two binding sites could coordinate to two other metals. Alternatively, three binding sites could coordinate to one metal and the other binding site could coordinate to another metal. The same is true for any multidentate ligands.

In some embodiments, $L^a, L^b, L^c, L^d, L^e, L^f, L^g,$ and/or $L^h$, when present, may be a monodentate ligand. Suitable monodentate ligands, unless otherwise specifically indicated, may be represented by isocyanide ($R^aNC$, wherein $R^a$ is selected from ($C_{1-6}$)alkyl and aryl), carbonyl, cyanide, nitrite, thiocyanate, ammine ($NR^a$, wherein $R^a$ is selected from ($C_{1-6}$)alkyl and aryl), nitrile ($R^aCN$, wherein $R^a$ is selected from ($C_{1-6}$) alkyl and aryl) aqua, hydroxy, oxo, alkoxy, phenoxy, thiol, sulfide, phosphine ($P(R^a)_3$, wherein $R^a$ is selected from ($C_{1-6}$)alkyl and aryl), halide, or a heterocyclic compound such as, but not limited to, pyridine optionally substituted with one or more of ($C_{1-6}$)alkyl, halogen, nitro, hydroxy, thiol, or ($C_{1-6}$)alkoxy.

In some embodiments, $L^a, L^b, L^c, L^d, L^e, L^f, L^g,$ and/or $L^h$, when present, may be a bidentate ligand. In some embodiments, the bidentate ligand is optionally substituted 2-2'-bipyridine, as shown below:

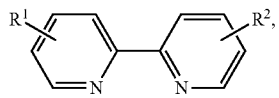

wherein $R^1$ and $R^2$ each represent one, two or three substituents and are each independently selected from hydrogen, halogen, ($C_{1-4}$)alkoxy, hydroxyl, nitro, amino, cyano, and ($C_{1-6}$)alkyl optionally substituted with halogen, hydroxyl, nitro, amino, cyano, ($C_{1-4}$)alkoxy, and phenyl, wherein the phenyl may be optionally substituted with ($C_{1-4}$)alkyl, halogen, hydroxyl, nitro, amino, ($C_{1-4}$)alkoxy, and cyano. In some embodiments, the bidentate ligand is optionally substituted β-diketonate, as shown below:

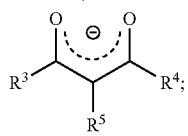

wherein $R^3$ and $R^4$ are each independently selected from and ($C_{1-6}$)alkyl optionally substituted with halogen, ($C_{1-4}$) alkoxy, or aryl; and $R^5$ is aryl or ($C_{1-6}$)alkyl. In some embodiments, the β-diketone is acetylacetonate. In other embodiments, the bidentate ligand is a diamine. In some cases, the diamine may be ethylenediamine or propylenediamine. In some embodiments, the bidentate ligand is an imine. In other embodiments, the bidentate ligand is a chelating phosphine ligand; in some of these embodiments, the chelating phosphine ligand may be bis(diphenylphosphino)ethane or bis(diphenylphosphino)methane. In other embodiments, the bidentate ligand is phenanthroline. In yet other instances, the bidentate ligand is 8-hydroxyquinoline. In still other instances, the bidentate ligand is a glycol. In some cases, the glycol may be ethylene glycol or propylene glycol. In further instances, the bidentate ligand is picolinic acid. In other instances, the bidentate ligand is 2-hydroxypyridine. In yet other instances, the bidentate ligand is pyridine-2-thiol.

In some embodiments, $L^a, L^b, L^c, L^d, L^e, L^f, L^g,$ and/or $L^h$, when present, may be a ligand with a denticity of more than two. These ligands, in some instances, may be selected from diethylenetriamine, cyclopentadienyl, ethylenediaminetetraacetate, oxo, sulfide, tetraazacyclotetradecane, and triaminotriethylamine. In some embodiments, the multidentate ligand is optionally substituted SALEN (shown below):

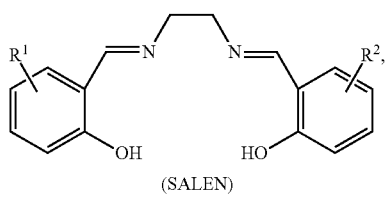

(SALEN)

wherein $R^1$ and $R^2$ each represent one, two or three substituents and are each independently selected from hydrogen, halogen, $(C_{1-4})$alkoxy, hydroxyl, nitro, amino, cyano, and $(C_{1-6})$alkyl optionally substituted with halogen, hydroxyl, nitro, amino, cyano, $(C_{1-4})$alkoxy, and phenyl, wherein the phenyl may be optionally substituted with $(C_{1-4})$alkyl, halogen, hydroxyl, nitro, amino, $(C_{1-4})$alkoxy, and cyano.

In some embodiments, $L^a$, $L^b$, $L^c$, $L^d$, $L^e$, $L^f$, $L^g$, and/or $L^h$, when present, may be a polyamine. In some embodiments, the polyamine is a diamine. In some embodiments, the polyamine is a triamine. In some embodiments, the polyamine is a tetramine. In some embodiments, the polyamine is selected from diethylenetriamine, tetraazacyclotetradecane, triaminotriethylamine, ethylenediamine, and propylenediamine.

In some embodiments, $L^a$, $L^b$, $L^c$, $L^d$, $L^e$, $L^f$, $L^g$, and/or $L^h$, when present, are selected independently from SALEN, which may be optionally substituted by $(C_{1-6})$alkyl, halogen, nitro, or $(C_{1-6})$alkoxy. In some embodiments, $L^a$, $L^b$, $L^c$, $L^d$, $L^e$, $L^f$, $L^g$, and/or $L^h$, when present, are selected independently from 2-2'-bipyridine, which may be optionally substituted by $(C_{1-6})$alkyl, halogen, nitro, or $(C_{1-6})$alkoxy. In some embodiments, $L^a$, $L^b$, $L^c$, $L^d$, $L^e$, $L^f$, $L^g$, and/or $L^h$, when present, are selected independently from ethylenediammine. In some embodiments, $L^a$, $L^b$, $L^c$, $L^d$, $L^e$, $L^f$, $L^g$, and/or $L^h$, when present, are selected independently from phenanthroline. In some embodiments, $L^a$, $L^b$, $L^c$, $L^d$, $L^e$, $L^f$, $L^g$, and/or $L^h$, when present, are selected independently from 2-2'-bipyridine, which may be optionally substituted by $(C_{1-6})$alkyl. In some embodiments, $L^a$, $L^b$, $L^c$, $L^d$, $L^e$, $L^f$, $L^g$, and/or $L^h$, when present, are selected independently from SALEN, which may be optionally substituted by $(C_{1-6})$alkyl.

Each of the ligands $L^a$, $L^b$, $L^c$ and $L^d$ has its own denticity which is represented by, respectively, $w^a$, $w^b$, $w^c$ and $w^d$.

The number of each ligand $L^a$, $L^b$, $L^c$ and $L^d$ present is represented by $(L^a)_n(L^b)_o(L^c)_p(L^d)_q$. Each of n, o, p, and q are independently zero, one or two. The sum of $(n \cdot w^a)$ plus $(o \cdot w^b)$ plus $(p \cdot w^c)$ plus $(q \cdot w^d)$ is equal to (Q minus 2z). To illustrate, in example (a) above, Q is six, so there are six coordination sites available. There is one oxalate, so z is one. Therefore, the sum of $(n \cdot w^a)$ plus $(o \cdot w^b)$ plus $(p \cdot w^c)$ plus $(q \cdot w^d)$ is equal to (Q minus 2z), or four. In this particular example, there are two bipyridines, which could be represented by $L^a$=bipyridine, $w^a$ (which is the denticity) is two, and n is two. The equation would thus read:

$(n \cdot w^a)+(o \cdot w^b)+(p \cdot w^c)+(q \cdot w^d)=(Q$ minus $2z)(2 \cdot 2)+0+0+0=(6-(2 \cdot 1))4=4.$ To be perfectly clear, the ligands $L^a$, $L^b$, $L^c$ and $L^d$ do not have to be the same moiety or denticity. For instance, if a metal M has eight coordination sites Q, attached could be one carbonate (z=1, but two sites are used), two phenanthrolines (four sites total), a cyano (one site), and a chloro (one site). This representative equation would be:

$(n \cdot w^a)+(o \cdot w^b)+(p \cdot w^c)+(q \cdot w^d)=(Q$ minus $2z)(2 \cdot 2)+(1 \cdot 1)+(1 \cdot 1)+0=(8-(2 \cdot 1))6=6.$ In some embodiments, z is three. In some embodiments, z is two. In some embodiments, z is 2; Q is 6; ($L^a$) is 2-2'-bipyridine optionally substituted with $(C_{1-4})$alkyl; and o, p, and q are each zero. In some embodiments, BD is oxalate, z is two, ($L^a$) is 2-2'-bipyridine optionally substituted with $(C_{1-4})$alkyl; o, p, and q are each zero; and M is cobalt, iron, or chromium.

In some embodiments, BD is oxalate and z is 2 or 3. In some embodiments, BD is oxalate; z is 2 or 3; and M is cobalt, iron, or chromium.

In some embodiments, A is azide. In some embodiments, A is (—$NO_2$). Both the azide and the (—$NO_2$) make use of one coordination site; so when one azide or (—$NO_2$) is present, Q-1 sites are available for other ligands, as shown below.

In some embodiments, y is any integer up to and including Q, the coordination number of the metal M. In some embodiments, y is an integer selected from 2, 3, 4, 5, 6, 7, or 8. In some embodiments, y is 2. An example of a complex where A is an azide and y is 2 is shown in illustrative structure (d) below (charges and counter ions not shown):

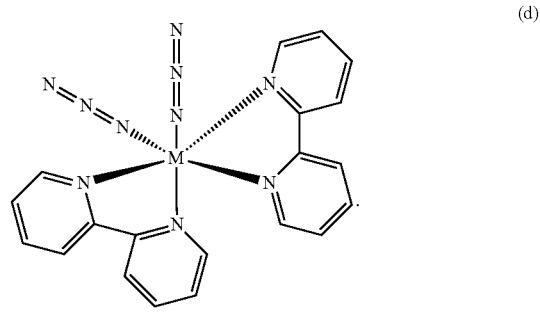

(d)

Unlike in the oxalate examples above (which each used two available coordination sites (Q) of M), each azide uses only one coordination site. The same is true of (—$NO_2$), as shown below:

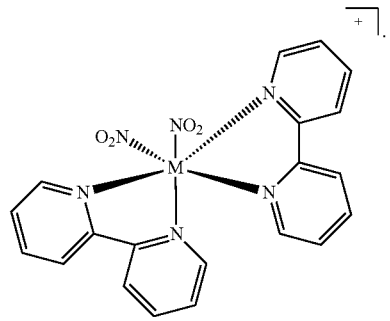

Each of the ligands $L^e$, $L^f$, $L^g$ and/or $L^h$ has its own denticity which is represented by, respectively, $w^e$, $w^f$, $w^g$ and $w^h$.

The number of each ligand $L^e$, $L^f$, $L^g$ and $L^h$ present is represented by $(L^e)_n(L^f)_o(L^g)_p(L^h)_q$. Each of n, o, p, and q are independently zero, one or two. The sum of $(n \cdot w^e)$ plus $(o \cdot w^f)$ plus $(p \cdot w^g)$ plus $(q \cdot w^h)$ is equal to (Q minus y). To illustrate, in example (d) above, Q is six, so there are six coordination sites available. There are two azides, so y is two. Therefore, the sum of $(n \cdot w^e)$ plus $(o \cdot w^f)$ plus $(p \cdot w^g)$ plus $(q \cdot w^h)$ is equal to (Q minus y), or four. In this particular example, there are two bipyridines, which could be represented by $L^e$=bipyridine, $w^e$ (which is the denticity) is two, and n is two. The equation would thus read:

$(n \cdot w^e)$ plus $(o \cdot w^f)$ plus $(p \cdot w^g)$ plus $(q \cdot w^h)=(Q$ minus $y)(2 \cdot 2)+0+0+0=(6-2)4=4.$ As above, the ligands $L^e$, $L^f$, $L^g$ and $L^h$ do not have to be the same moiety or denticity.

In some embodiments, y is 2; ($L^e$) and ($L^f$) are each 2-2'-bipyridine optionally substituted with $(C_{1-4})$alkyl; and p and q are each zero.

When referring to a substituent that can be a ligand, any hydrogen atoms on the moiety may or may not be present after complexing with the metal atom. For instance, reference to 8-hydroxyquinoline as a ligand choice is meant to indicate that, while 8-hydroxyquinoline is the stand-alone moiety, the hydrogens may not be present once the moiety is complexed with the metal atom (not all metal bonds drawn below):

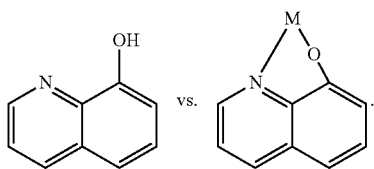

Similarly, a pyrazole ligand may be drawn in either of the ways shown below:

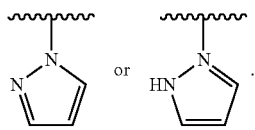

The total charge on the complex will, however, change depending on the number of hydrogens that remain present.

In some embodiments, the photoresist may include a photoacid generator ("PAG"). Photoacid generators are compounds that create acid when exposed to light or electrons. Photoacid generators are known in the art and will not be discussed here. In some embodiments, the PAG is used to replace a ligand on the metal, forming a more labile sulfonate. In some embodiments, the PAG will be blended with the complex prior to film formation.

The solubility of the complex may be dependent upon a number of different factors, including the charge of the complex, the ligands involved, the counter ion used, and the solvent utilized. In some embodiments, the minimum solubility of the complex is 0.5% by weight. In some embodiments, the minimum solubility of the complex is 1.0% by weight. In some embodiments, the minimum solubility of the complex is 2.0% by weight. In some embodiments, the minimum solubility of the complex is 3.0% by weight. In some embodiments, the solubility of the complex is between 0.5% by weight and 20% by weight. In some embodiments, the solubility of the complex is between 1.0% by weight and 20% by weight. In some embodiments, the solubility of the complex is between 2.0% by weight and 20% by weight. In some embodiments, the solubility of the complex is between 3.0% by weight and 20% by weight. The solubility of the complex may be determined in any suitable solvent that allows for dissolution of the complex and the ability for subsequent spin coating.

Photoresists are generally prepared following known procedures. For example, a resist can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether, propylene glycol monomethyl ether acetate; lactates such as ethyl lactate or methyl lactate, with ethyl lactate being preferred; proponiates, particularly methyl propionate, ethyl propionate and ethyl ethoxy propionate; a Cellosolve ester such as methyl Cellosolve acetate; an aromatic hydrocarbon such as toluene or xylene; a ketone such as methylethyl ketone or cyclohexanone; and the like. A halogenated solvent, such as a dichloromethane or chlorobenzene, may also be used. Exemplary, but non-limiting, solvents include: acetonitrile, 1,2-dichloroethane, diglyme (diethylene glycol dimethyl ether), 1,2-dimethoxy-ethane (glyme, DME), dimethyl-formamide (DMF), dimethyl sulfoxide (DMSO), ethanol, ethyl lactate, hexane, methanol, nitromethane, tetrahydrofuran (THF), toluene, propylene glycol monomethyl ether acetate (PGMEA, or PMA), propylene glycol monomethyl ether (PM), cyclohexanone, and 2-hepatanone. Additionally, aqueous solvents may be used including pure water, alkaline (<pH 14) and acidic solutions (>pH 1). Furthermore, two or three component mixtures of any of the solvents listed above may be used. In some embodiments, the solvent is selected from at least one of toluene, propylene glycol monomethyl ether acetate (PGMEA, or PMA), propylene glycol monomethyl ether (PM), methanol, ethanol, hexane, ethyl lactate, cyclohexanone, or 2-heptanone. In some embodiments, the solvent is selected from at least one of ethyl lactate, propylene glycol monomethyl ether acetate (PGMEA, or PMA), propylene glycol monomethyl ether (PM), cyclohexanone, and 2-heptanone. In some embodiments, the solvent is selected from at least one of toluene, PMA, PM, methanol, ethanol, and hexane.

Any of the solvents listed above may also be used as developer. It is important to note that the same solvent (or solvent mixture) used for spin coating (casting) will, in most cases, not be the same solvent (or solvent mixture) to be used as the developer for a specific complex.

In some embodiments, the thickness of the film formed by spin coating is no more than two times the line width. For instance, if one is resolving 10 nm lines, the thickness of the coating should be no more than 20 nm. In some embodiments, the thickness of the film formed by spin coating is between 10 and 40 nm. In some embodiments, the thickness of the film is between 20 and 40 nm. In some embodiments, the concentration of the solids to form these film thicknesses will be between 0.5% and 3% by weight. In some embodiments, the concentration of the solids is between 1.0% and 3.0% by weight. In some embodiments, the concentration of the solids is between 2.0% and 3.0% by weight. In some embodiments, the concentration of the solids is between 1.5% and 2.5% by weight.

Figure 1A:
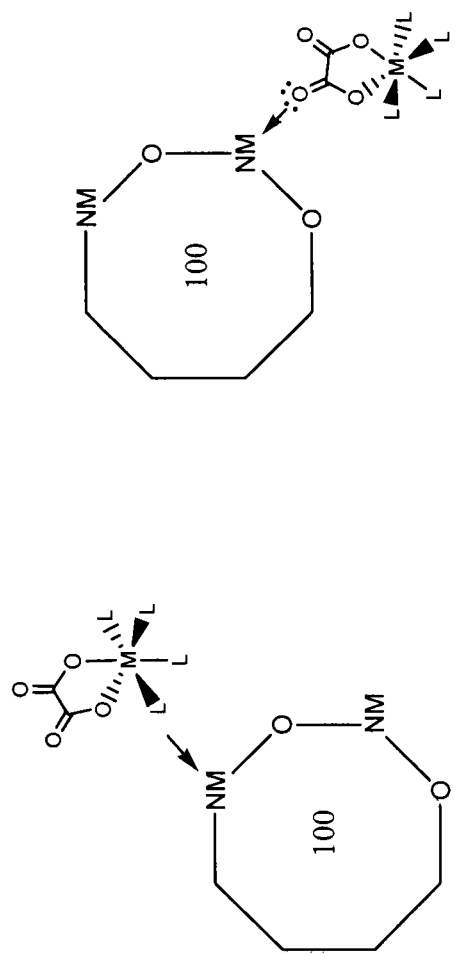
Figure 1C:
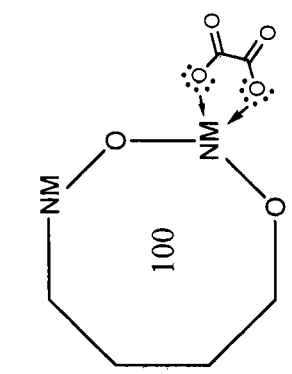

In some aspects of the invention, one or more of the complexes disclosed herein may be in the form of a nanoparticle. Suitable nanoparticles for use in this application include organometallic or inorganic clusters containing two or more metal atoms. In some embodiments, the nanoparticles have a molecular weight between 300 and 3,000,000 g/mol. In some embodiments, the nanoparticles have a molecular weight between 300 and 1,000,000 g/mol. In some embodiments, the nanoparticles have a molecular weight between 150 and 1,500,000 g/mol. In some embodiments, the nanoparticles have a molecular weight between 150 and 30,000 g/mol. In some embodiments, the nanoparticles have a molecular weight between 150 and 150,000 g/mol. In some embodiments, the nanoparticles have a molecular weight between 300 and 3,000 g/mol. In some embodiments, the nanoparticles have a diameter between 1 and 20 nanometers. In some embodiments, the nanoparticle diameter is between 0.5 and 10 nanometers. In some embodiments, the nanoparticle diameter is between 5 and 10 nanometers. In some embodiments, the nanoparticle diameter is between 0.5 and 5 nanometers. In some embodiments, the nanoparticle diameter is between 1 and 10 nanometers. In some embodiments, the nanoparticle diameter is between 1 and 5 nanometers. In some embodiments, the nanoparticle diameter is between 1 and 2 nanometers. In some embodiments, the nanoparticle diameter is between 0.5 to 5.0 nm and the molecular weight is between 150 and 30,000 g/mol. These nanoparticles may be used in an EUV photoresist. In some embodiments, the invention relates to a nanoparticle that includes at least one complex $(BD_2)_zM(L^a)_n(L^b)_o(L^c)_p(L^d)_q$ or $(A)_yM(L^e)_n(L^f)_o(L^g)_p(L^h)_q$, wherein all terms and substituents are as defined supra. To be perfectly clear, all embodiments described supra for the complexes themselves also apply to the complexes in the nanoparticles described herein. In some embodiments, the entire complex may be attached to the surface of a nanoparticle by the use of a connecting ligand and/or a surfactant. In other embodiments, it is not necessary for the entire $(BD_2)_zM(L^a)_n(L^b)_o(L^c)_p(L^d)_q$ or $(A)_yM(L^e)_n(L^f)_o(L^g)_p(L^h)_q$ complex to be attached to the surface of a nanoparticle; that is, one of the ligands $L^a$, $L^b$, $L^c$, $L^d$, $L^e$, $L^f$, $L^g$, or $L^h$, when present, optionally may be native to the nanoparticle. As an example, if the nanoparticle is comprised of a metal oxide, for instance, hafnium oxide, a portion of the complex disclosed herein may be attached to one of the metal (e.g., hafnium) or oxygen atoms native to the nanoparticle. This is illustrated in FIGS. 1A and 1B, in which the nanoparticle is designated by 100. The metal (M) of the complex may be bonded to a native oxygen atom of the nanoparticle 100, as illustrated in FIG. 1A. Conversely, one or more of the oxalate, carbonate, azide or —$NO_2$ ligands of the complex or the ligands $L^a$, $L^b$, $L^c$, $L^d$, $L^e$, $L^f$, $L^g$ and $L^h$, may be bonded to a native metal (NM) atom of the nanoparticle 100, as shown in FIG. 1B. In most, but not necessarily all, cases, the ligand L that bridges between the nanoparticle metal NM and the metal of the complex M will be an anionic ligand. To be perfectly clear, in these embodiments, the entire $(BD_2)_zM(L^a)_n(L^b)_o(L^c)_p(L^d)_q$ or $(A)_yM(L^e)_n(L^f)_o(L^g)_p(L^h)_q$ complex may not be added to the nanoparticle, but the entire complex will be present with the inclusion of the native nanoparticle atoms. FIG. 1C illustrates the attachment of the complex to the nanoparticle metal NM through an oxalate oxygen that is not coordinated with the complex metal M. In instances such as those shown in FIG. 1C, the complex is present in its entirety without the inclusion of a native nanoparticle atom. The nanoparticles used herein must be dispersible in a suitable solvent that allows for subsequent spin coating.

Figure 1E:
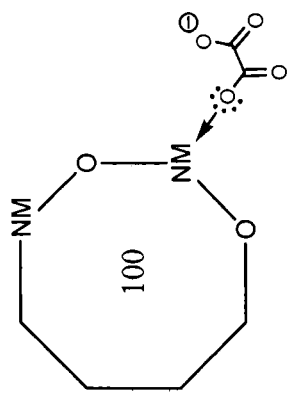
Figure 1D:
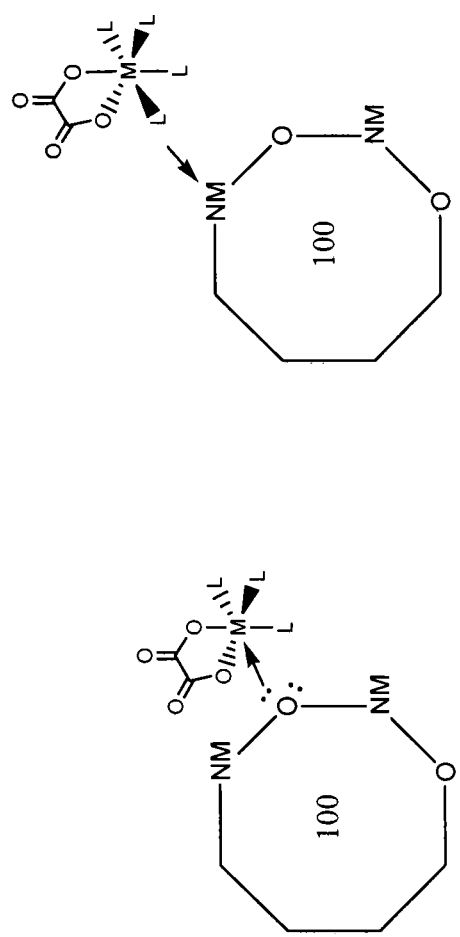

In some embodiments, the invention relates to a metal-containing nanoparticle including an oxalate. In some embodiments, the invention relates to a metal-containing nanoparticle including a carbonate. In some embodiments, the invention relates to a metal-containing nanoparticle including an azide. In some embodiments, the invention relates to a metal-containing nanoparticle including —$NO_2$. Examples of a nanoparticle that include an oxalate are shown in FIGS. 1C, 1D, and 1E. In these examples, an oxalate is bound to a metal atom (NM) on the nanoparticle 100. FIG. 1C illustrates the attachment of the complex to the nanoparticle metal NM through an oxalate oxygen. In FIG. 1D, the oxalate utilizes one coordination site of the nanoparticle metal NM (that is, one oxygen of the oxalate is bound to the metal atom), while FIG. 1E shows two coordination sites of the nanoparticle metal NM bound to the oxalate.

In some embodiments, the nanoparticles comprise surfactants. The surfactants prevent the separate nanoparticles from bonding to each other when such bonding is not desired. Suitable surfactants are known to those of skill in the art and will not be discussed here. In some instances, ligands will play the role of surfactants to keep nanoparticles, organometallic, of inorganic clusters in solution. [B. Cardineau, M. Krysak, M. Trikeriotis, R. L. Brainard et al., "Tightly bound ligands for hafnium nanoparticle EUV resists," Proc. SPIE 8322, 83220V/83221-83220V/83210 (2012).]

In some embodiments, multi-nuclear structures may be formed when at least two metal/ligand complexes attach together, forming a structure comprised of the complexes disclosed herein. As described above, in these cases, portions of the $(BD_2)_zM(L^a)_n(L^b)_o(L^c)_p(L^d)_q$ or $(A)_yM(L^e)_n(L^f)_o(L^g)_p(L^h)_q$ complex will be present, as coordination sites may be used by the bonding of one complex to another complex. To illustrate, if two complexes are connected by their metal atoms, one of the metal atoms will effectively be acting as a ligand of the other metal atom, taking up an available coordination site:

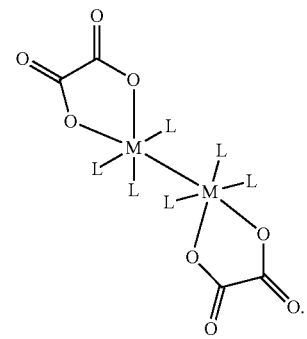

In this instance, the metal of the second complex acts as a ligand for the metal of the first complex, in that it occupies an available coordination site. If the metal atom of one complex is attached to two other complexes, then two of the metal's coordination site would be utilized by the two other complexes, as shown below:

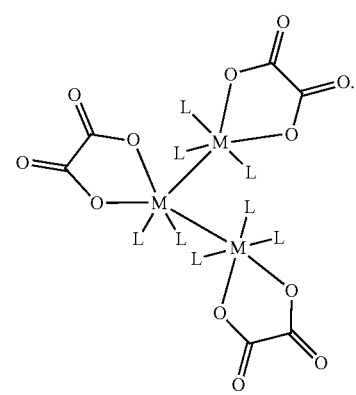

In another configuration, the metal of one complex may be attached to the metal of another complex or to a ligand of another complex. The structure below illustrates a complex in which one metal is bound to a ligand of one complex and a metal of another complex:

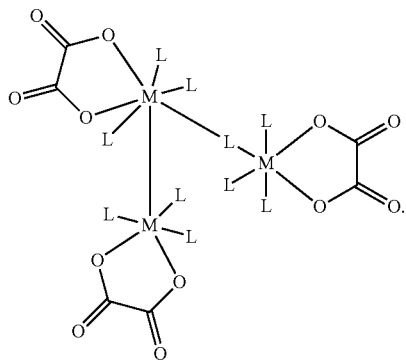

In some embodiments, the invention relates to a method of using any of the nanoparticles disclosed herein as an EUV photoresist.

In some embodiments, the invention relates to a process for forming a photoresist. The process includes forming a substrate-complex wafer by applying at least one of the complexes described herein to a substrate by spin coating. In some embodiments, the process further includes baking the substrate-complex wafer and exposing the substrate-complex wafer to EUV or e-beam radiation. In some embodiments, baking is performed at approximately 90° C. for 30 seconds to 360 seconds.

Throughout this specification the terms and substituents retain their definitions.

Unless otherwise specified, alkyl is intended to include linear, branched, or cyclic hydrocarbon structures and combinations thereof. A combination would be, for example, cyclopropylmethyl. Hydrocarbon refers to any substituent comprised of hydrogen and carbon as the only elemental constituents. Lower alkyl refers to alkyl groups of from 1 to 6 carbon atoms. Examples of lower alkyl groups include methyl, ethyl, propyl, isopropyl, cyclopropyl, butyl, s- and t-butyl, cyclobutyl and the like.

Aryl means (i) a phenyl group (or benzene); (ii) a bicyclic aromatic ring system; or (iii) a tricyclic aromatic ring system. The aromatic 6- to 14-membered carbocyclic rings include, e.g., benzene, naphthalene, indane, tetralin, and fluorene. As used herein, aryl refers to residues in which one or more rings are aromatic, but not all need be.

Arylalkyl refers to a substituent in which an aryl residue is attached to the parent structure through alkyl. Examples are benzyl, phenethyl and the like. In one embodiment, the alkyl group of an arylalkyl is an alkyl group of from 1 to 6 carbons.

Alkoxy or alkoxyl refers to groups of from 1 to 8 carbon atoms of a straight, branched or cyclic configuration and combinations thereof attached to the parent structure through an oxygen. Examples include methoxy, ethoxy, propoxy, isopropoxy, cyclopropyloxy, cyclohexyloxy and the like. Lower-alkoxy refers to groups containing one to four carbons. For the purpose of this application, alkoxy and lower alkoxy include methylenedioxy and ethylenedioxy.

The term "halogen" means fluorine, chlorine, bromine or iodine. In one embodiment, halogen may be fluorine or chlorine.

Heterocycle means a cycloalkyl or aryl carbocycle residue in which from one to four carbons is replaced by a heteroatom selected from the group consisting of N, O and S. The nitrogen and sulfur heteroatoms may optionally be oxidized, and the nitrogen heteroatom may optionally be quaternized. Unless otherwise specified, a heterocycle may be non-aromatic or aromatic. Examples of heterocycles that fall within the scope of the invention include pyrrolidine, pyrazole, pyrrole, indole, quinoline, isoquinoline, tetrahydroisoquinoline, benzofuran, benzodioxan, benzodioxole (commonly referred to as methylenedioxyphenyl, when occurring as a substituent), tetrazole, morpholine, thiazole, pyridine, pyridazine, pyrimidine, thiophene, furan, oxazole, oxazoline, isoxazole, dioxane, tetrahydrofuran and the like. It is to be noted that heteroaryl is a subset of heterocycle in which the heterocycle is aromatic. Examples of heterocyclyl residues additionally include piperazinyl, 2-oxopiperazinyl, 2-oxopiperidinyl, 2-oxo-pyrrolidinyl, 2-oxoazepinyl, azepinyl, 4-piperidinyl, pyrazolidinyl, imidazolyl, imidazolinyl, imidazolidinyl, pyrazinyl, oxazolidinyl, isoxazolidinyl, thiazolidinyl, isothiazolyl, quinuclidinyl, isothiazolidinyl, benzimidazolyl, thiadiazolyl, benzopyranyl, benzothiazolyl, tetrahydrofuryl, tetrahydropyranyl, thienyl, benzothienyl, thiamorpholinyl, thiamorpholinylsulfoxide, thiamorpholinylsulfone, oxadiazolyl, triazolyl and tetrahydroquinolinyl. Any of the heterocycles listed above may be optionally substituted with halogen, $(C_{1-4})$alkoxy, hydroxyl, nitro, amino, cyano, and $(C_{1-6})$alkyl optionally substituted with halogen, hydroxyl, nitro, amino, cyano, $(C_{1-4})$alkoxy, and phenyl, wherein the phenyl may be optionally substituted with $(C_{1-4})$alkyl, halogen, hydroxyl, nitro, amino, $(C_{1-4})$alkoxy, and cyano. As used herein, the term "optionally substituted" may be used interchangeably with "unsubstituted or substituted". The term "substituted" refers to the replacement of one or more hydrogen atoms in a specified group with a specified radical.

Although this invention is susceptible to embodiment in many different forms, preferred embodiments of the invention are shown. It should be understood, however, that the present disclosure is to be considered as an exemplification of the principles of this invention and is not intended to limit the invention to the embodiments illustrated. It may be found upon examination that certain members of the claimed photoresist complexes are not patentable to the inventors in this application. In this event, subsequent exclusions of species from the compass of applicants' claims are to be considered artifacts of patent prosecution and not reflective of the inventors' concept or description of their invention; the invention encompasses all of the members of the complexes described herein that are not already in the possession of the public.

Experimental Results

Mononuclear Cr, Fe, Co, Ni and Cu complexes containing oxalate, various 2,2'-bipyridine, 1,10-phenanthroline, and ethylenediamine ligands were prepared using reported synthetic routes and were characterized by UV-Vis and IR spectroscopy. (See, for instance, Bailair, J. C. et al. *Inorganic Syntheses* 2007, 1, 35-38; Lescouëzec, R. et al. *Inorganica Chimica Acta* 2003, 350, 131-142; Bajpai, S. K. et al. *Journal of the Indian Chemical Society* 1980, 57, 219-221; Berka, L. H. et al. *Inorganic Chemistry* 1970, 9, 2705-2709; Koenig, E. et al. *Inorganic Chemistry* 1968, 7, 1848-1855; Broomhead, J. A. et al. *Inorganic Chemistry* 1968, 7, 1388-1393; Evangelio, E et. al. *Dalton Trans.*, 2012, 41, 8010; Maki, N Bull. *Chem. Soc. Japan* 1969, 42, 2275.) Structures of the compounds prepared are shown in Table 2. Most of these compounds are made by directly reacting a simple metal salt with the desired ligands. Complexes are typically crystallized out of aqueous solution which limits the selection of counter ions. The anionic complexes were generally isolated as the benzyl-triphenyl-phosphonium (BTP) salts and the cationic complexes as hexafluorophosphate and hexafluoroantimonate salts. Attempts were made to isolate some anionic complexes as tetraalkylammonium salts, but these did not readily precipitate from aqueous solution.

TABLE 2
Oxalate/diimine or diammine compounds prepared.
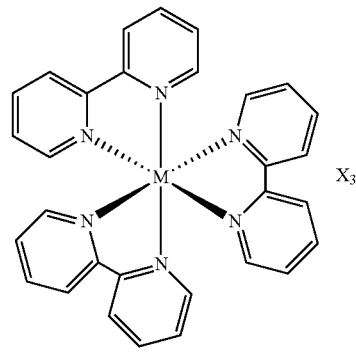
100 M = Cr, X = $PF_6^-$
101 M = Fe, X = $PF_6^-$
102 M = Co, X = $PF_6^-$
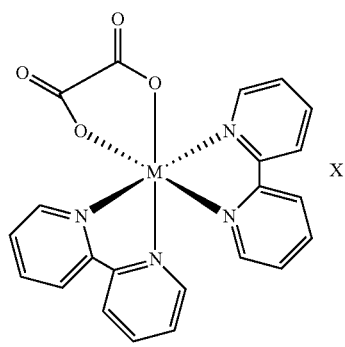
103 M = Cr, X = $PF_6^-$
104 M = Cr, X = $SbF_6^-$
105 M = Fe, X = $PF_6^-$
106 M = Co, X = $PF_6^-$
107 M = Co, X = $SbF_6^-$
108 M = Co, X = $I^-$
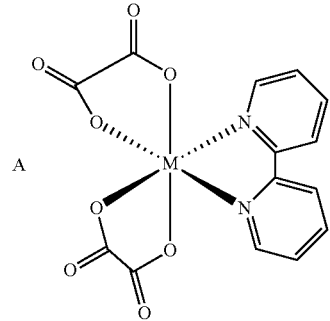
109 M = Cr, A = $BTP^+$
110 M = Fe, A = $BTP^+$
111 M = Co, A = $BTP^+$ TABLE 2-continued
Oxalate/diimine or diammine compounds prepared.
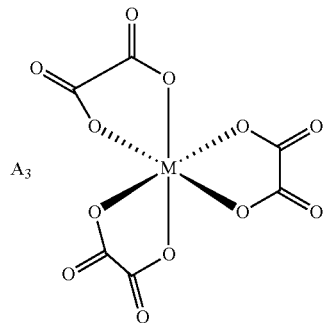
A₃
112 M = Cr, A = BTP⁺
113 M = Fe, A = BTP⁺
114 M = Co, A = BTP⁺
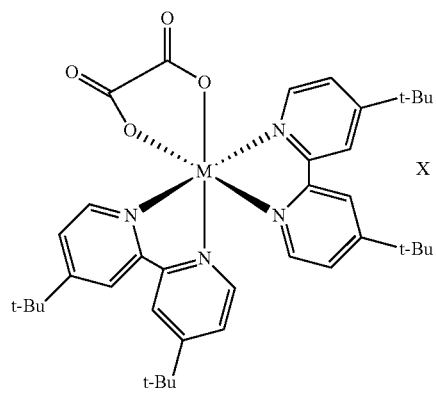
X
115 M = Cr, X = PF₆⁻
116 M = Co, X = PF₆⁻
117 M = Co, X = SbF₆⁻
118 M = Co, X = I⁻
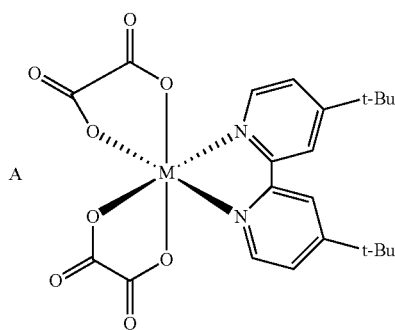
A
119 M = Cr, X = BTP⁺
120 M = Co, X = BTP⁺

TABLE 2-continued
Oxalate/diimine or diammine compounds prepared.
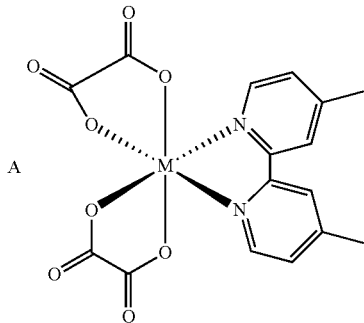
120 M = Fe, A = BTP+
121 M = Cr, A = BTP+
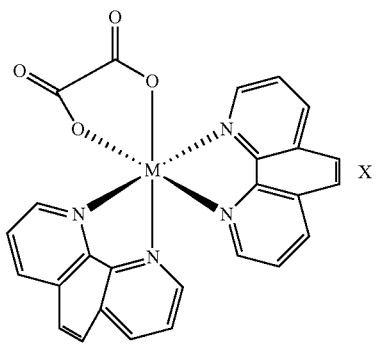
122 M = Cr, X = PF6-
123 M = Fe, X = PF6-
124 M = Co, X = PF6-
125 M = Co, X = I-
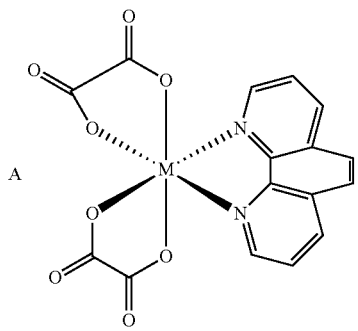
126 M = Fe, X = BTP+
127 M = Cr, X = BTP+
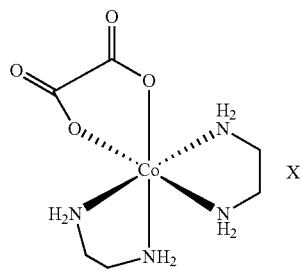
128 X = PF6-
129 X = Cl-

TABLE 2-continued
Oxalate/diimine or diammine compounds prepared.
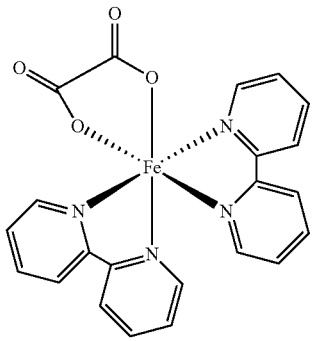
130
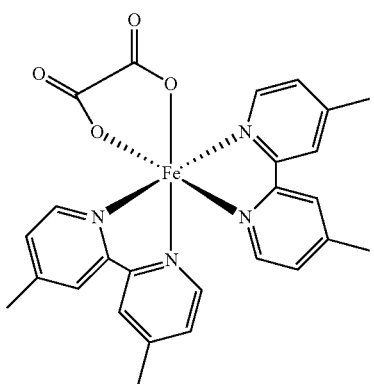
131
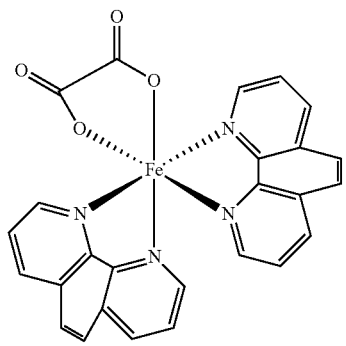
132
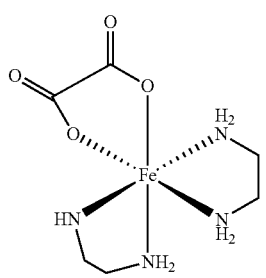
133

TABLE 2-continued
Oxalate/diimine or diammine compounds prepared.
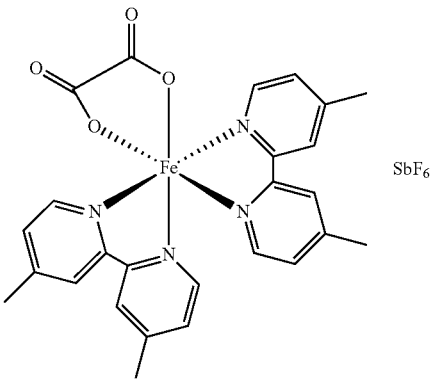
134
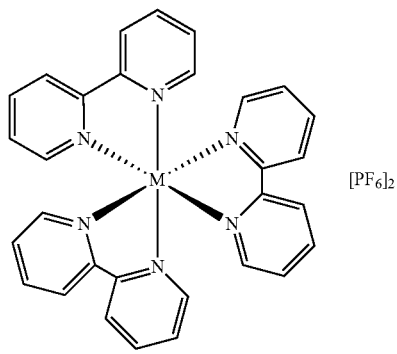
135
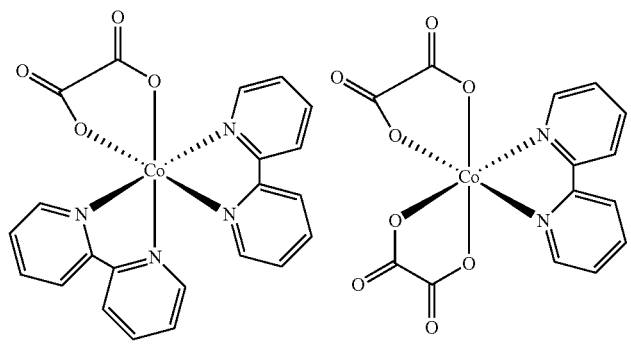
136

TABLE 2-continued
Oxalate/diimine or diammine compounds prepared.
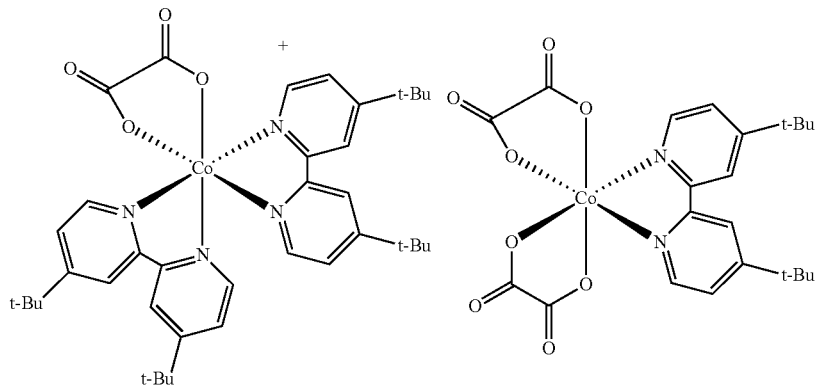
137
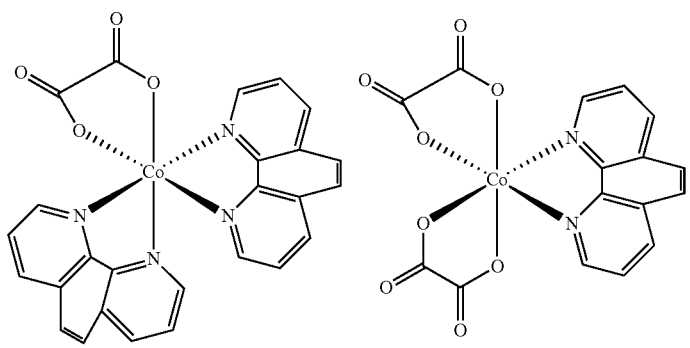
138
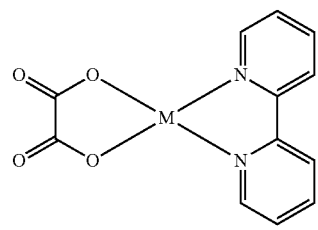
139 M = Cu
140 M = Ni
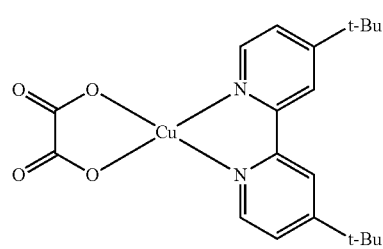
141

TABLE 2-continued
Oxalate/diimine or diammine compounds prepared.
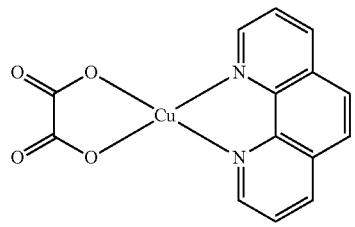
142
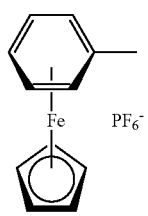
143
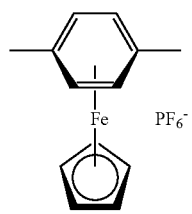
144
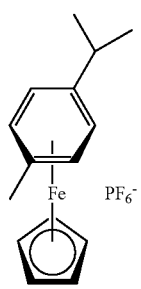
145
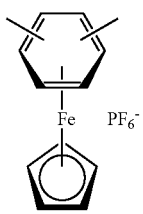
146
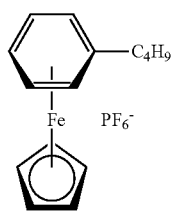
147

TABLE 2-continued

Oxalate/diimine or diammine compounds prepared.

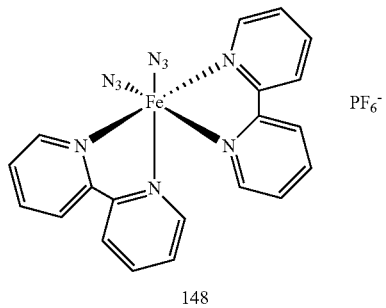

148

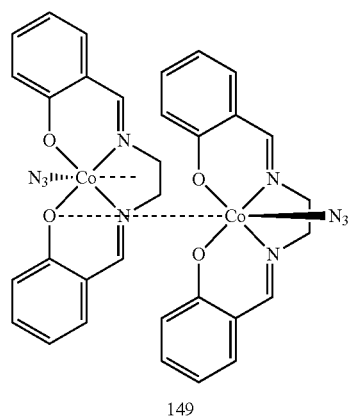

149

Screening for Solubility, Coating and EUV Response

A summary of the solubility, coating and EUV response for all of the compounds is shown in Table 3. Initial screening of the compounds was performed to determine whether they had suitable solubility and coating characteristics to perform as resists. As can be seen from the table, certain combinations of ligand, metal, counter ion, and solvent did not produce ideal results; however, varying these parameters into different combinations may result in more desirable photoresists. Solutions in the 1-3% by mass were prepared and spin coated on 4" silicon wafers.

TABLE 3

Solubility, coating, contrast curve and imaging data for metal oxalate/diimine/diammine and [CpFe(arene)]⁺ complexes.

| Compound # | Soluble? | [b]Coating Solvent | Coating Quality | Pre-bake | [b]Developing Solvent | Contrast Curve Result | Egel (mJ/cm$^2$) | Emax (mJ/cm$^2$) | Imaging Data? | Esize (mJ/cm$^2$) | Resolution (nm) | modulation (nm) |
|---|---|---|---|---|---|---|---|---|---|---|---|---|
| 100 | Y | 1:1 ACN/EL | good | 60 s @ 90 | 85% IPA(aq) | no image | | | n | | | |
| 101 | no data | | | | | | | | | | | |
| 102 | Y | 1:1 ACN/EL | good | 60 s @ 90 | 85% IPA(aq) | image at >1400 mJ/cm$^2$ | | | n | | | |
| 103 | Y | 1:1 ACN/EL | poor | 60 s @ 90 | 10% IPA(aq) | image at high dose | | | n | | | |
| 104 | Y | 1:1 ACN/EL | poor | 60 s @ 90 | 10% IPA(aq) | no image | | | n | | | |
| 105 | Y | 2:1 ACN/EL | crystalline | | | | | | | | | |
| 106 | y | 2:1 ACN/EL | poor | 60 s @ 90 | 95% IPA(aq) | no image | | | n | | | |
| 107 | y | 2:1 ACN/EL | poor | 60 s @ 90 | 20% IPA(aq) | poor image | ~40 | | n | | | |
| 109 | y | 1:1 ACN/EL | good | 60 s @ 90 | 1:1 acetone/ PGMEA | ok image | ~25 | | y | 70 | 30 | |

TABLE 3-continued

Solubility, coating, contrast curve and imaging data for metal oxalate/diimine/diammine and [CpFe(arene)]+ complexes.

| Compound # | Soluble? | [b]Coating Solvent | Coating Quality | Prebake | [b]Developing Solvent | Contrast Curve Result | Egel (mJ/cm$^2$) | Emax (mJ/cm$^2$) | Imaging Data? | Esize (mJ/cm$^2$) | Resolution (nm) | modulation (nm) |
|---|---|---|---|---|---|---|---|---|---|---|---|---|
| 110 | y | 1:2 ACN/EL | good | 60 s @ 90 | 1:1 acetone/ PGMEA | good image | | ~5 | y | 50 | | 16 |
| 111 | Y | 33/66 ACN/EL | good | 60 s @ 90 | 6:4 acetone/ PGMEA | good image | 0 | 8 | y | <1 | 30 | 15 |
| 112 | y | EL | good | 60 s @ 90 | 4:6 acetone/ PMA | poor contrast | | | n | | | |
| 113 | y | EL | good | 60 s @ 90 | 1:2 acetone/ PGMEA | good image | | ~25 | n | | | |
| 114 | y | 1:3 ACN/EL | good | 60 s @ 90 | 1:1 acetone/ PGMEA | good image | 0 | 3 | no image | | | |
| 115 | Y | 1:1 ACN/EL | good | 60 s @ 90 | 10% IPA(aq) | ok image | | | n | | | |
| 116 | y | 1:2 ACN/EL | good | 60 s @ 90 | H$_2$O | ok image | | ~28 | n | | | |
| 117 | no data | | | | | | | | | | | |
| 118 | no data | | | | | | | | | | | |
| 119 | yes | EL | good | 60 s @ 90 | 5% IPA(aq) | poor | | | y | 5 | 50 | yes |
| 120 | no data | | | | | | | | n | | | |
| 121 | y | 3:1 ACN/EL | good | 60 s @ 90 | 1:2 acetone/ PGMEA | good image | 0 | 33 | n | | | |
| 108, 122, 124-5, 127-130, 132-3, 136, 138-9, 140, 142 | n | | | | | | | | | | | |
| 123, 126 | y | 1:1 ACN/EL | crystalline | | | | | | | | | |
| 131 | y | 1:1 ACN/EL | poor | 60 s @ 90 | 2:8 ACN/ acetone | no image | | | | | | |
| 134 | no data | | | | | | | | | | | |
| 135 | y | CAN | ok | 60 s @ 90 | 5% IPA(aq) | grainy image, positive tone | | <10 | n | | | |
| 137 | y | 1:1 ACN/EL | good | 60 s @ 90 | ? | no image | | | | | | |
| 141 | y | EL | good | 60 s @ 90 | 5% IPA(aq) | no image | | | | | | |
| 143-144 | y | EL | crystalline | | | | | | | | | |
| 145-147 | Y | EL | good | no | 10% IPA(aq) | very grainy image | | | n | | | |
| 148 | y | 1:1 ACN/EL | good | 60 s @ 90 | H$_2$O | no image | | | | | | |
| 149 | y | 1:1 DMF/EL | Fair | 60 s @ 90 | 1:3 IPA:ethyl acetate | no image | | | | | | |

[a]Solvent ratios are given for volume.
[b]PGMEA = propyleneglycol-methyletheracetate, PMA = 1-methoxy-2-propanol acetate, IPA = 2-propanol, EL = ethyl lactate, ACN = acetonitrile.

Contrast Curve and Imaging Data

Further screening was carried out by collecting EUV contrast curves using the Berkeley Direct Contrast Tool from 1-100 mJ/cm$^2$ in 1 mJ/cm$^2$ steps and then, for particularly sensitive resists, from 1-20 mJ/cm$^2$ in 0.4 mJ/cm$^2$ steps. The approximate values of $E_{max}$ for most of the compounds listed in Table 3 are taken from visual inspection of the contrast curves. Many of the tested compounds produced images. With one exception, all of the compounds gave negative images with the exposed material being less soluble in the developing solvent than the unexposed material. The exception was [Fe(bpy)$_3$][PF$_6$]$_2$ which gave a positive image.

Figure 2A:
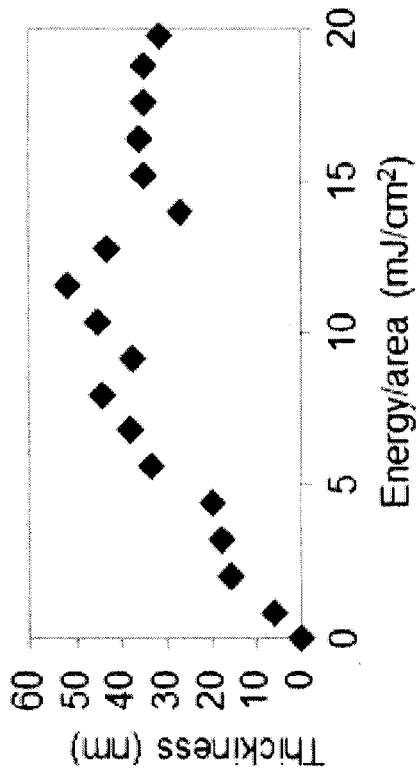
FIGS. 2A-2C depict contrast curves for three photoresists of the invention.
Figure 2B:
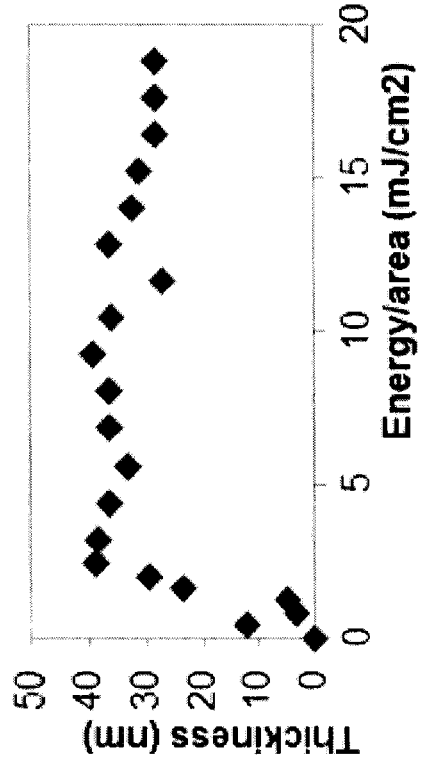
Figure 2C:
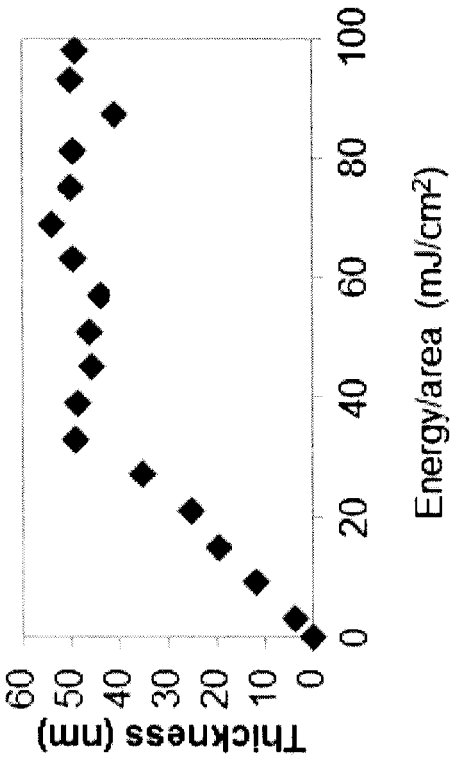

Profilometer studies of the exposed and developed wafers yielded the contrast curves for [BTP]$_3$[Co(ox)$_3$], BTP[Co(bpy)(ox)$_2$] and BTP[Cr(Mebpy)(ox)$_2$] shown in FIGS. 2A-2C. For all three contrast curves, the observed thickness of the spots begins to increase at the lowest energies used, indicating that $E_{gel}$ is effectively 0 mJ/cm$^2$ for these compounds. $E_{gel}$ is a measure of the sensitivity of a negative resist.

Figure 3:
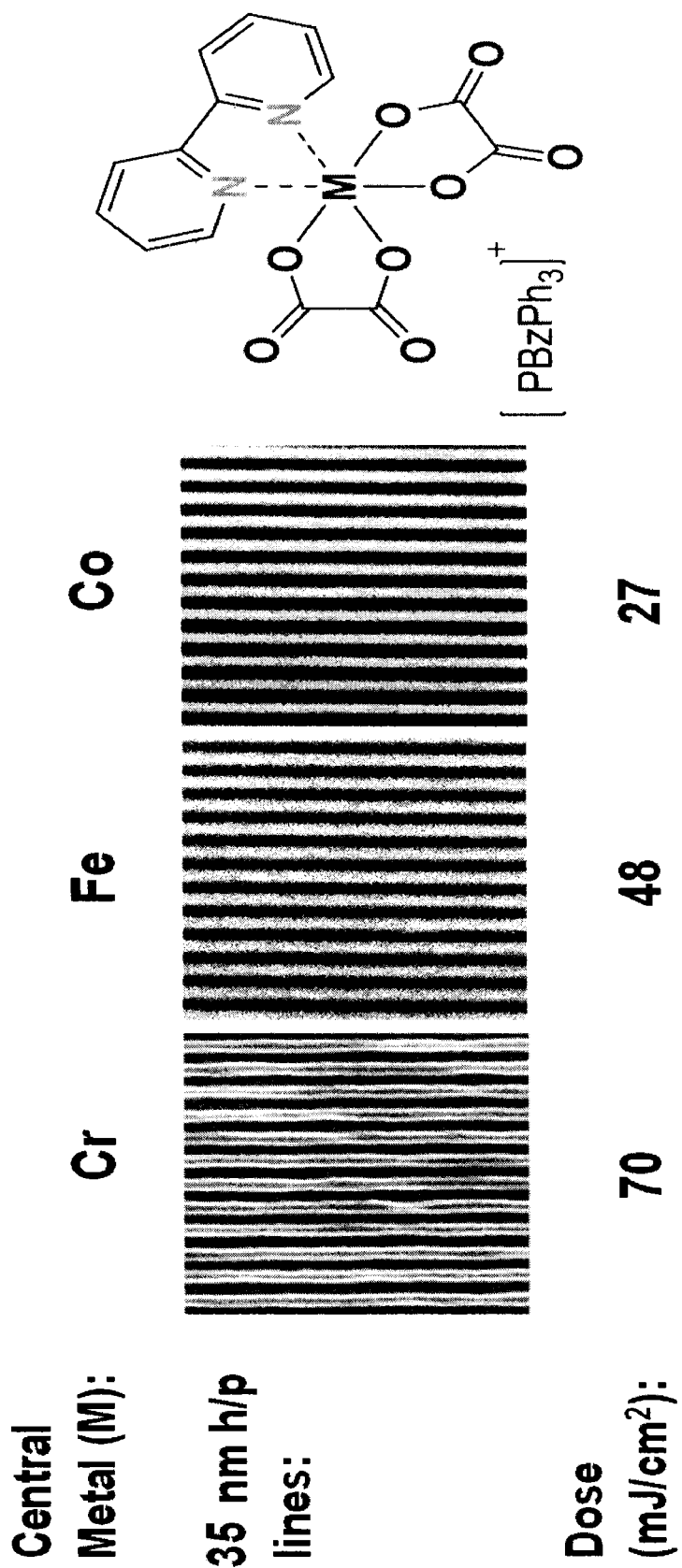
FIG. 3 depicts lithographic results of three photoresists of the invention.

FIG. 3 shows EUV lithography results for three different complexes. All three complexes have two oxalates and one bipyridine ligand, with [PBzPh$_3$]$^+$ as the counter ion, as shown below:

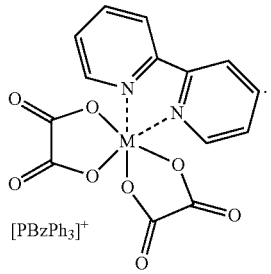

Variations were made in the central metal (M), such that Cr, Fe and Co were tested. For this combination of parameters, Co was the most reactive complex, followed by Fe and Cr.

Figure 4:
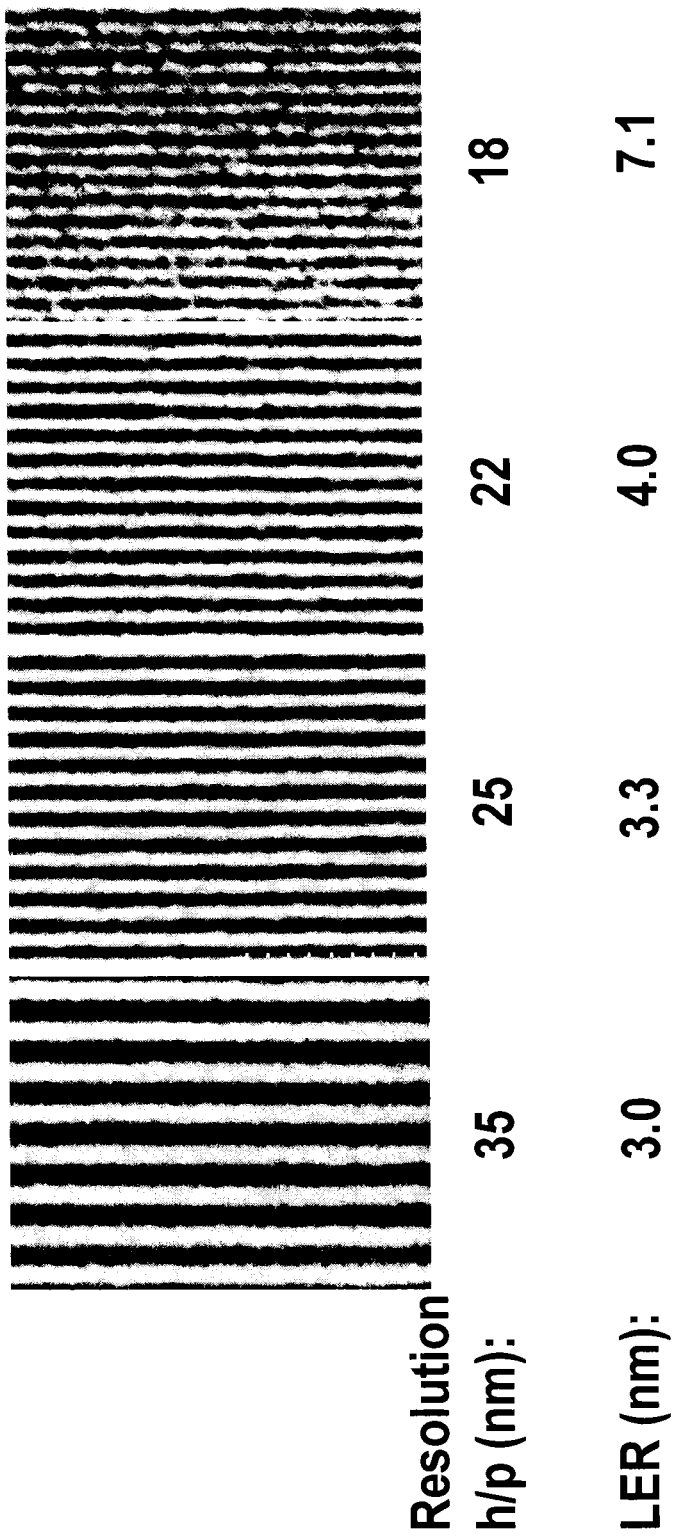
FIG. 4 shows lithographic results for one photoresist of the invention.

FIG. 4 shows EUV lithograph results for a resist utilizing the cobalt-containing complex shown below:

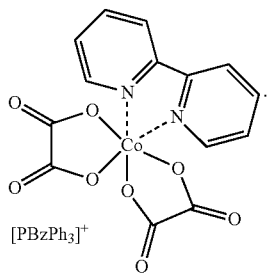

This resist had a thickness of 30 nm and was developed in methyl ethyl ketone for 15 seconds. The dose was 30 mJ/cm$^2$, and the post-apply bake was performed at 90° C. for 60 seconds. No post-exposure bake was performed. As is shown in FIG. 4, this resist demonstrates both excellent resolution and line edge roughness.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A photoresist comprising at least one complex (BD$_2$)$_z$M (L$^a$)$_n$(L$^b$)$_o$(L$^c$)$_p$(L$^d$)$_q$ or (A)$_y$M(L$^e$)$_n$(L$^f$)$_o$(L$^g$)$_p$(L$^h$)$_q$, wherein:
   M is a metal having a coordination number of Q, wherein M is selected from zirconium, manganese, aluminum, vanadium, titanium, chromium, manganese, iron, cobalt, copper, zinc, gallium, germanium, arsenic, molybdenum, ruthenium, rhodium, silver, cadmium, indium, tin, antimony, tellurium, iodine, thulium, hafnium, tantalum, tungsten, rhenium, osmium, iridium, gold, mercury, thallium, lead, and bismuth;
   Q is an integer selected from 2, 3, 4, 5, 6, 7, or 8;
   BD$_2$ is oxalate or carbonate;
   L$^a$, L$^b$, L$^c$ and L$^d$ are ligands, each having a denticity of, respectively, w$^a$, w$^b$, w$^c$ and w$^d$;
   z is 1, 2 or 3;
   n, o, p, and q are independently zero, one or two;
   the sum of (n·w$^a$) plus (o·w$^b$) plus (p·w$^c$) plus (q·w$^d$) is equal to (Q minus 2z);
   A is selected in each instance from azide and (—NO$_2$);
   L$^e$, L$^f$, L$^g$ and L$^h$ are ligands, each having a denticity of, respectively, w$^e$, w$^f$, w$^g$ and w$^h$;
   y is any integer up to and including Q; and
   the sum of (n·w$^e$) plus (o·w$^f$) plus (p·w$^g$) plus (q·w$^h$) is equal to (Q minus y);
   wherein said complex is balanced by a counter ion, if necessary.

2. The photoresist according to claim 1, wherein BD$_2$ is oxalate.

3. The photoresist according to claim 1, wherein M is selected from manganese, iron, antimony, tellurium, tin, cobalt, bismuth, chromium, and copper.

4. The photoresist according to claim 1, wherein M is selected from chromium, copper, iron, tin, cobalt, and bismuth.

5. The photoresist according to claim 1, wherein Q is selected from 4 or 6.

6. The photoresist according to claim 1, wherein L$^a$, L$^b$, L$^c$, L$^d$, L$^e$, L$^f$, L$^g$ and L$^h$, when present, are selected independently in each instance from:
   carbonyl; cyano; nitrite; thiocyanate; nitrile; aqua; hydroxy; oxo; alkoxy; phenoxy; thiol; sulfide; halogen; phenanthroline; polymine; bis(diphenylphosphino)ethane; bis(diphenylphosphino)methane; imine; ethylenediaminetetraacetate; cyclopentadienyl; R$^a$NC; R$^a$CN; NR$^a$; P(R$^a$)$_3$;
   a heterocyclic compound;

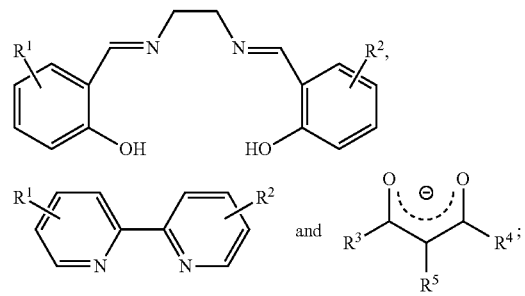

wherein R$^a$ is selected from (C$_{1-6}$)alkyl and aryl;
R$^1$ and R$^2$ each represent one, two or three substituents and are each independently selected from hydrogen, halogen, (C$_{1-4}$)alkoxy, hydroxyl, nitro, amino, cyano, and (C$_{1-6}$)alkyl optionally substituted with halogen, hydroxyl, nitro, amino, cyano, and phenyl, wherein the phenyl may be optionally substituted with (C$_{1-6}$)alkyl, halogen, hydroxyl, nitro, amino, and cyano;
R$^3$ and R$^4$ are each independently selected from and (C$_{1-6}$)alkyl optionally substituted with halogen, (C$_{1-4}$)alkoxy, or aryl; and
R$^5$ is aryl or (C$_{1-6}$)alkyl.

7. The photoresist according to claim 6, wherein L$^a$, L$^b$, L$^c$, L$^d$, L$^e$, L$^f$, L$^g$ and L$^h$, when present, are selected independently from ethylenediamine, phenanthroline,

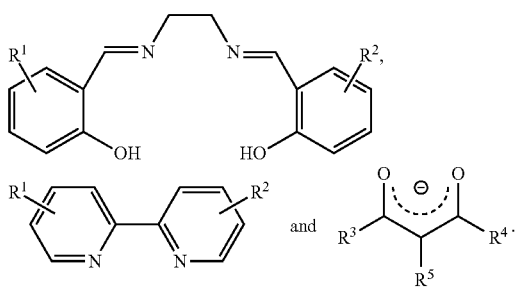

8. The photoresist according to claim 1, wherein $BD_2$ is oxalate; and z is 2 or 3.

9. The photoresist according to claim 8, wherein z is 2; Q is 6; ($L^a$) is 2-2'-bipyridine optionally substituted with $(C_{1-6})$alkyl; and o, p, and q are each zero.

10. The photoresist according to claim 8, wherein M is cobalt, iron, or chromium.

11. The photoresist according to claim 10, wherein z is 2; Q is 6; ($L^a$) is 2-2'-bipyridine optionally substituted with (($C_{1-6}$)alkyl; and o, p, and q are each zero.

12. The photoresist according to claim 1, wherein y is 2.

13. The photoresist according to claim 1, wherein y is 2; ($L^e$) and ($L^f$) are each 2-2'-bipyridine optionally substituted with $(C_{1-6})$alkyl; and p and q are each zero.

14. The photoresist according to claim 1, wherein the minimum solubility of said complex is 0.5% by weight.

15. The photoresist according to claim 1, wherein said complex is in the form of a nanoparticle.

16. The photoresist according to claim 1, wherein said counter ion is selected from $P(R)_4^+$, $N(R)_4^+$, $S(R)_3^+$, and $I(R)_2^+$, wherein R is independently selected in each instance from $(C_1-C_8)$alkyl, aryl, and aryl$(C_{1-8})$alkyl.

17. The photoresist according to claim 1, wherein at least two of said complexes are present, forming a multi-nuclear structure.

18. A nanoparticle comprising at least one complex $(BD_2)_z M(L^a)_n(L^b)_o(L^c)_p(L^d)_q$ or $(A)_y M(L^e)_n(L^f)_o(L^g)_p(L^h)_q$, wherein:
   M is a metal having a coordination number of Q;
   Q is an integer selected from 2, 3, 4, 5, 6, 7, or 8;
   $BD_2$ is oxalate or carbonate;
   $L^a$, $L^b$, $L^c$ and $L^d$ are ligands, each having a denticity of, respectively, $w^a$, $w^b$, $w^c$ and $w^h$;
   z is 1, 2 or 3;
   n, o, p, and q are independently zero, one or two;
   the sum of $(n \cdot w^a)$ plus $(o \cdot w^b)$ plus $(p \cdot w^c)$ plus $(q \cdot w^d)$ is equal to (Q minus 2z);
   A is selected in each instance from azide and ($-NO_2$);
   $L^e$, $L^f$, $L^g$ and $L^h$ are ligands, each having a denticity of, respectively, $w^e$, $w^f$, $w^g$ and $w^h$;
   y is any integer up to and including Q; and
   the sum of $(n \cdot w^e)$ plus $(o \cdot w^f)$ plus $(p \cdot w^g)$ plus $(q \cdot w^h)$ is equal to (Q minus y);
   wherein said complex is balanced by a counter ion, if necessary; and
   wherein one of the ligands $L^a$, $L^b$, $L^c$, $L^d$, $L^e$, $L^f$, $L^g$, or $L^h$, when present, optionally may be native to the nanoparticle.

19. The nanoparticle of claim 18, wherein M is selected from zirconium, manganese, aluminum, vanadium, titanium, chromium, manganese, iron, cobalt, nickel, copper, zinc, gallium, germanium, arsenic, molybdenum, ruthenium, rhodium, palladium, silver, cadmium, indium, tin, antimony, tellurium, iodine, thulium, hafnium, tantalum, tungsten, rhenium, osmium, iridium, platinum, gold, mercury, thallium, lead, and bismuth.

* * * * *